(12) United States Patent
Hasegawa et al.

(10) Patent No.: US 7,758,717 B2
(45) Date of Patent: Jul. 20, 2010

(54) WAFER TREATING APPARATUS

(75) Inventors: Koji Hasegawa, Kyoto (JP); Akira Morita, Kyoto (JP); Kenichiro Arai, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1180 days.

(21) Appl. No.: 11/362,635

(22) Filed: Feb. 27, 2006

(65) Prior Publication Data

US 2006/0191635 A1 Aug. 31, 2006

(30) Foreign Application Priority Data

Feb. 28, 2005 (JP) ............................. 2005-053418

(51) Int. Cl.
*C23F 1/00* (2006.01)
(52) U.S. Cl. .............................. 156/345.23; 156/345.1; 156/345.11
(58) Field of Classification Search ............... 156/345.1, 156/345.11, 345.23
See application file for complete search history.

(56) References Cited

U.S. PATENT DOCUMENTS 5,227,001 A * 7/1993 Tamaki et al. .......... 156/345.22
5,605,487 A * 2/1997 Hileman et al. ................. 451/5
2004/0192050 A1 9/2004 Yamashita

FOREIGN PATENT DOCUMENTS

| JP | 2002-203821 | 7/2002 |
|---|---|---|
| JP | 2002-319578 | 10/2002 |
| JP | 2003-229407 | 8/2003 |
| JP | 2004-142045 | 5/2004 |
| JP | 2004-288920 | 10/2004 |

* cited by examiner

*Primary Examiner*—Karla Moore
(74) *Attorney, Agent, or Firm*—Ostrolenk Faber LLP

(57) ABSTRACT

On a hot plate, jigs and wafers are joined by bonding wax. A first transport mechanism, a posture change mechanism, a pusher and a second transport mechanism transport the jigs joined with the wafers from the hot plate to a treating transport mechanism. The treating transport mechanism immerses the jigs joined with the wafers in a treating solution stored in a treating tank. Thus, the wafers may be thinned, or otherwise treated, without a turn table directly contacting and damaging the wafers as in the prior art.

12 Claims, 5 Drawing Sheets

WAFER TREATING APPARATUS

BACKGROUND OF THE INVENTION (1) Field of the Invention

This invention relates to a wafer treating apparatus for treating surfaces of semiconductor wafers.

(2) Description of the Related Art

Conventionally, apparatus for treating surfaces of wafers include, as disclosed in Japanese Unexamined Patent Publication No. 2004-142045, a BG (back grinding) apparatus and a CMP apparatus, for grinding a surface of each wafer with a turn table pressed directly on the surface of the wafer. The CMP apparatus is used to polish, with the turn table, the back surface of a wafer having a circuit formed on the front surface. After the thickness of the wafer is reduced as above, the wafer is transferred to a subsequent process such as dicing.

The conventional examples with such construction have the following drawback.

In the conventional apparatus, the turn table is placed in direct contact with the wafer for grinding or polishing action. When the turn table presses on the wafer with an increased force, the wafer can be damaged.

SUMMARY OF THE INVENTION

This invention has been made having regard to the state of the art noted above, and its object is to provide a wafer treating apparatus for thinning each wafer by acting on one surface thereof without damaging the wafer.

The above object is fulfilled, according to this invention, by a wafer treating apparatus comprising a joining device for joining jigs and wafers with a fixing composition; a treating tank for storing a liquid for treating surfaces of the wafers; a holding mechanism for holding the jigs joined with the wafers, as immersed in the liquid stored in the treating tank; and a transport mechanism for transporting the jigs joined with the wafers between the joining device and the holding mechanism.

With the wafer treating apparatus according to this invention, the jigs and wafers are joined together by the fixing composition on the joining device. The transport mechanism transports the jigs joined with the wafers from the joining device to the holding mechanism. The holding mechanism immerses the jigs joined with the wafers in the treating solution stored in the treating tank. Thus, the wafers may be thinned, or otherwise treated, without a turn table directly contacting and damaging the wafers as in the prior art.

In one example of the wafer treating apparatus described above, the joining device includes a heating mechanism for holding and heating the jigs, and an application mechanism for applying the fixing composition to a surface of each jig held by the heating mechanism.

In this example, the application mechanism applies the fixing composition to a surface of each jig heated by the heating mechanism, thereby to melt the fixing composition applied. The melted fixing composition joins the jigs and wafers together.

In the example where the joining device includes the heating mechanism and application mechanism, the apparatus may further comprise a jig storage unit for storing a plurality of jigs, a wafer storage unit for storing a plurality of wafers, a jig transport mechanism for transporting the jigs between the jig storage unit and the heating mechanism, and a wafer transport mechanism for transporting the wafers between the wafer storage unit and the heating mechanism.

Where the apparatus has the jig storage unit, wafer storage unit, jig transport mechanism and wafer transport mechanism, the jig transport mechanism transports each jig from the jig storage unit to the heating mechanism, and the wafer transport mechanism transports each wafer from the wafer storage unit to the heating mechanism. Then, the jig and wafer are joined together by the heating mechanism.

In one example where the apparatus has the jig storage unit, wafer storage unit, jig transport mechanism and wafer transport mechanism, the jig transport mechanism transports the jigs from the jig storage unit to the heating mechanism, the heating mechanism heats the jigs, the application mechanism applies the fixing composition to a surface of each jig, and the wafer transport mechanism transports the wafers from the wafer storage unit to the jigs placed on the heating mechanism.

The jig transport mechanism transports each jig from the jig storage unit to the heating mechanism. The application mechanism applies the fixing composition to a surface of the jig heated by the heating mechanism. The wafer transport mechanism transports each wafer from the wafer storage unit to the jig placed on the heating mechanism. Thus, the wafer is placed on the surface of the jig where the melted fixing composition is present. The melted fixing composition joins the jig and wafer together.

In another example where the apparatus has the jig storage unit, wafer storage unit, jig transport mechanism and wafer transport mechanism, the transport mechanism transports the jigs joined with the wafers having surfaces treated in the treating tank, from the holding mechanism to the joining device, the heating mechanism heats the jigs to melt the fixing composition, the wafer transport mechanism transports the wafers from the jigs placed on the heating mechanism to the wafer storage unit, and the jig transport mechanism transports the jigs from the heating mechanism to the jig storage unit after the fixing composition is removed from the jigs.

After the transport mechanism transports the jigs joined with the wafers having surfaces treated in the treating tank, from the holding mechanism to the joining device, the heating mechanism heats the jigs to melt the fixing composition. Then, the wafer transport mechanism transports the wafers from the jigs placed on the heating mechanism to the wafer storage unit, thereby separating the wafers from the jigs. After the separation, the melted fixing composition remains on the jigs. The jig transport mechanism transports the jigs from the heating mechanism to the jig storage unit after removing the fixing composition from the jigs.

In the example where the joining device includes the heating mechanism and application mechanism, the transport mechanism may include a first transport mechanism for removing the jigs joined with the wafers from the heating mechanism; a posture change mechanism for turning the jigs removed by the first transport mechanism from horizontal posture to vertical posture; and a second transport mechanism for transporting the jigs turned to vertical posture by the posture change mechanism to the holding mechanism.

Where the transport mechanism includes the first transport mechanism, posture change mechanism and second transport mechanism, as part of the action of the transport mechanism to transport the jigs joined with the wafers from the joining device to the holding mechanism, the first transport mechanism removes the jigs from the heating mechanism. The posture change mechanism turns the removed jigs from horizontal posture to vertical posture. Further, the second transport mechanism transports the jigs turned to vertical posture to the holding mechanism. The above operations constitute a series of steps for transporting the jigs joined with the wafers.

Where the transport mechanism includes the first transport mechanism, posture change mechanism and second transport mechanism, the second transport mechanism may be arranged to transport the jigs from the holding mechanism to the posture change mechanism; the posture change mechanism may be arranged to turn the jigs transported by the second transport mechanism from vertical posture to horizontal posture; and the first transport mechanism may be arranged to transport the jigs turned to horizontal posture by the posture change mechanism to the heating mechanism.

As part of the action of the transport mechanism to transport the jigs joined with the wafers from the holding mechanism to the joining device, the second transport mechanism transports the jigs from the holding mechanism to the posture change mechanism. Then, the posture change mechanism turns the transported jigs from vertical posture to horizontal posture. Further, the first transport mechanism transports the jigs turned to horizontal posture to the heating mechanism. The above operations constitute a series of steps for transporting the jigs joined with the wafers.

In a further example where the apparatus has the jig storage unit, wafer storage unit, jig transport mechanism and wafer transport mechanism, the wafer transport mechanism and the jig transport mechanism are integrated into a wafer and jig transport mechanism for transporting the wafers and the jigs separately, the wafer and jig transport mechanism including a vertically movable base, and a wafer holding arm and a jig holding arm supported by the base to be movable backward and forward and swivelable relative to the base.

As noted above, the wafer and jig transport mechanism includes a vertically movable base, and a wafer holding arm and a jig holding arm supported by the base to be movable backward and forward and swivelable relative to the base. The wafer holding arm of the wafer and jig transport mechanism transports the wafers by holding, moving backward and forward and swiveling the wafers relative to the base. The jig holding arm transports the jigs by holding, moving backward and forward and swiveling the jigs relative to the base.

In one example where the transport mechanism includes the first transport mechanism, posture change mechanism and second transport mechanism, the posture change mechanism is arranged to change posture of a plurality of jigs en bloc.

In another example where the transport mechanism includes the first transport mechanism, posture change mechanism and second transport mechanism, the second transport mechanism is arranged to transport a plurality of jigs en bloc.

Where the posture change mechanism is arranged to change posture of a plurality of jigs en bloc, the first transport mechanism may pass the jigs to the posture change mechanism, and when the jigs reach a predetermined number, the posture change mechanism may turn the jigs en bloc from horizontal posture to vertical posture.

Where the posture change mechanism is arranged to change posture of a plurality of jigs en bloc, the posture change mechanism may be arranged to turn the jigs en bloc from horizontal posture to vertical posture, and the first transport mechanism may be arranged to fetch one jig at a time from the posture change mechanism.

Another example of the wafer treating apparatus noted above further comprises a cleaning tank for storing a cleaning liquid. In this example, the cleaning tank may be used to clean the jigs in at least one of periods before and after treatment in the treating tank.

That is, the jigs and wafers are cleaned in the cleaning tank when it is necessary to clean the jigs and wafers before the treatment in the treating tank. The jigs and wafers are cleaned in the cleaning tank also when it is necessary to clean the jigs and wafers after the treatment in the treating tank.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A preferred embodiment of this invention will be described in detail hereinafter with reference to the drawings.

Figure 1:
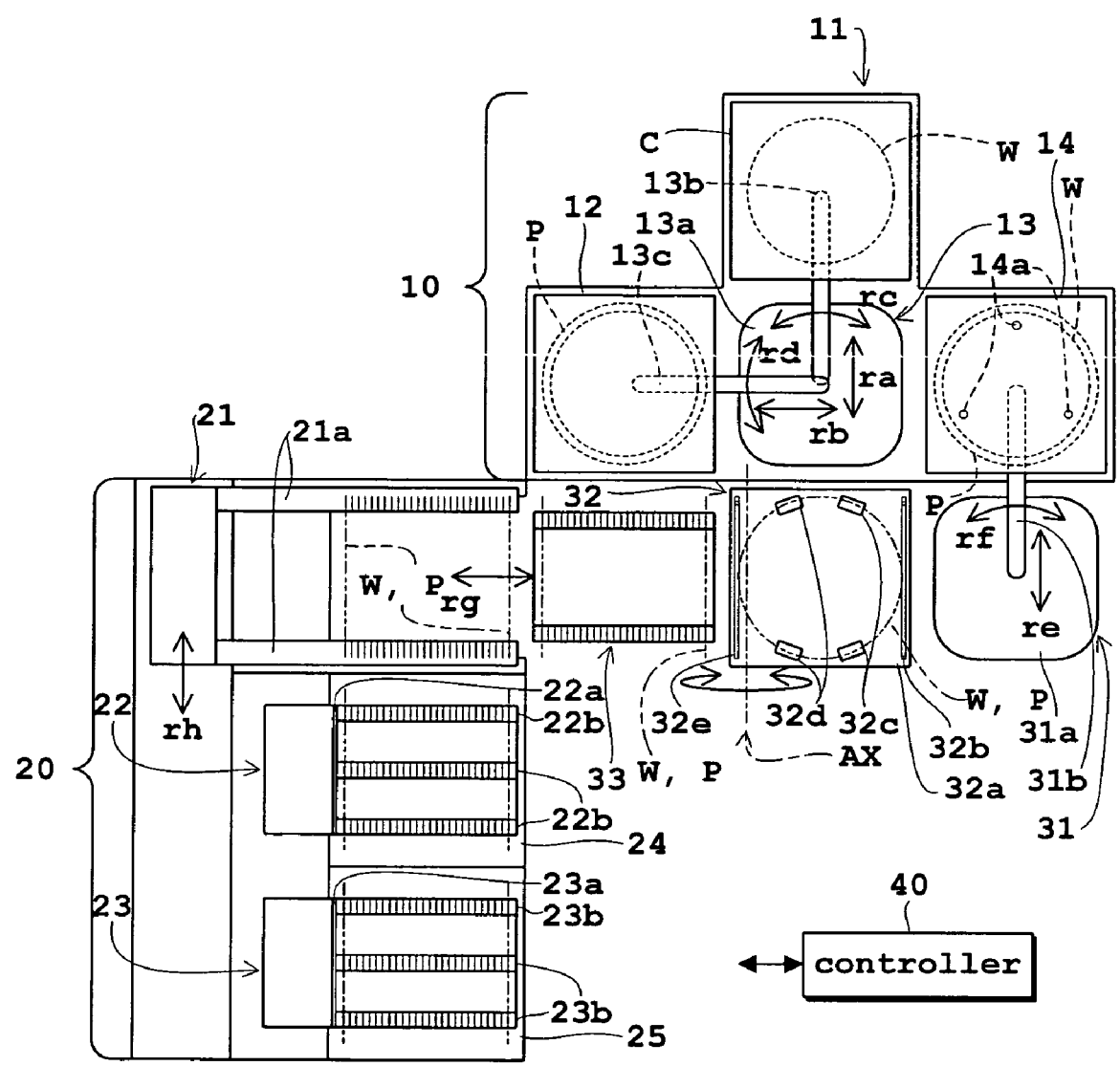
FIG. 1 is a plan view showing an outline of a wafer treating apparatus according to the invention.
Figure 2A:
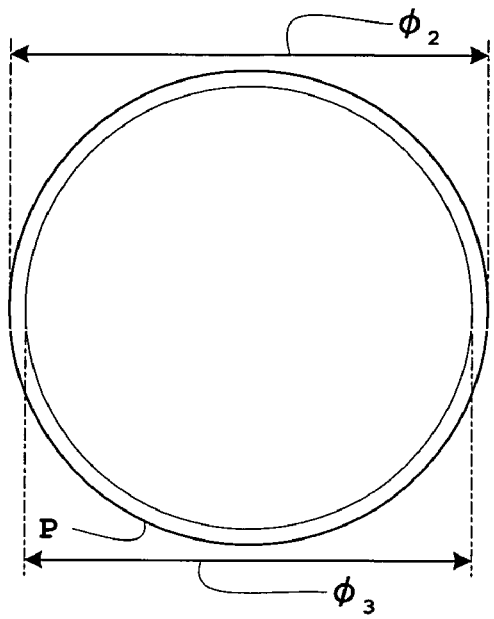
FIG. 2A is a plan view showing an outline of a jig.
Figure 2B:
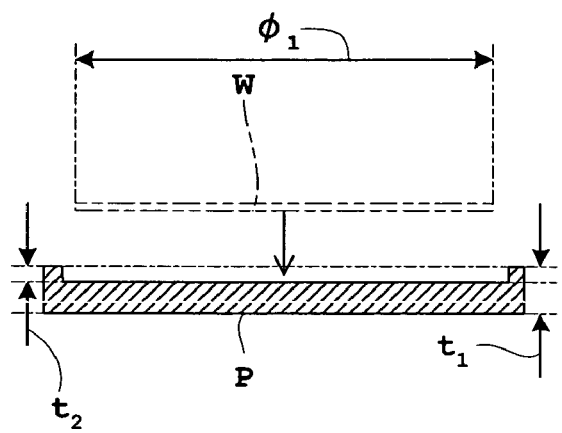
FIG. 2B is a sectional view showing an outline of the jig.
Figure 3:
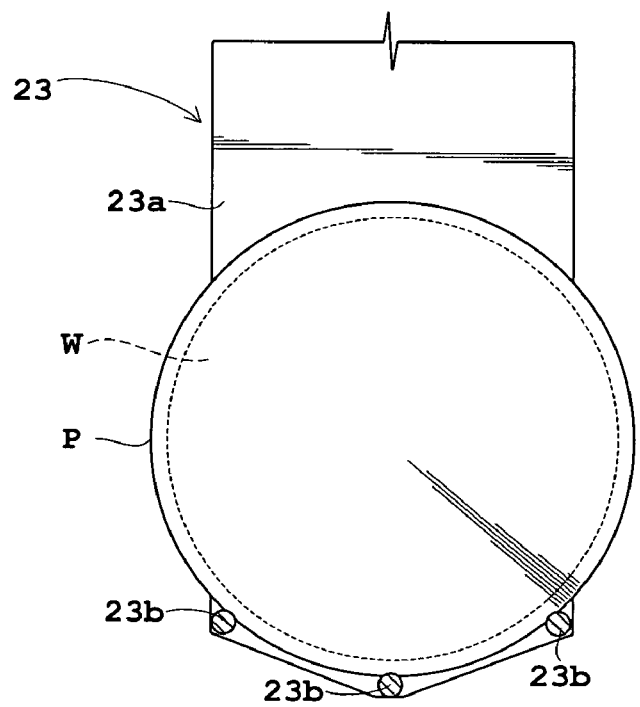
FIG. 3 is a front view showing an outline of a treating transport mechanism.

FIG. 1 is a plan view showing an outline of a wafer treating apparatus according to the invention. FIGS. 2A and 2B are views showing an outline of a jig. FIG. 3 is a front view showing an outline of a treating transport mechanism. This wafer treating apparatus immerses wafers W in a treating solution for chemically thinning the wafers W by acting on one surface of each wafer W.

As shown in FIG. 1, the wafer treating apparatus according to this invention includes an indexer 10 and a treating unit 20. Arranged between the indexer 10 and treating unit 20 are a hot plate 14, a first transport mechanism 31, a posture change mechanism 32 and a pusher 33.

The indexer 10 includes a cassette support table 11, a jig storage rack 12 and a wafer and jig transport mechanism 13. The cassette support table 11 has, placed thereon, a cassette C storing a plurality of (e.g. 25) wafers W to be treated or treated wafers W. The jig storage rack 12 stores a plurality of jigs P. The cassette C stores wafers W in horizontal posture and in multiple stages. The jig storage rack 12 also stores jigs P in horizontal posture and in multiple stages.

As shown in the plan view of FIG. 2A and the sectional view of FIG. 2B, each jig P is a disk-like object defining a recess sized to accommodate a wafer W, and a wall surrounding the recess. As described hereinafter, when sticking a wafer W to the jig P, the wafer W is placed in the recess. The jig P has a thickness $t_1$ including the height of the wall. The recess has a depth $t_2$. The wafer W has a diameter $\phi1$. The jig P has a diameter $\phi2$. The recess has a diameter $\phi3$. In this embodiment, the jigs P are formed of amorphous carbon or SiC. The thickness $t_1$ of each jig P is 3 mm. The depth $t_2$ of the recess is 1 mm. The diameter φ1 of wafer W is 200 mm. The diameter φ2 of jig P is 220 mm. The diameter φ3 of the recess is 210 mm. Amorphous carbon or SiC has chemical resistance with respect to a treating solution used in thinning treatment (an alkaline etching solution in this embodiment, e.g. caustic potash (KOH)), and heat resistance, and has a thermal expansion coefficient equal to that of wafers W.

As shown in FIG. 1, the wafer and jig transport mechanism 13 transports wafers W and jigs P individually, and has a base 13a, a wafer holding arm 13b and a jig holding arm 13c. The base 13a is vertically movable. The wafer holding arm 13b holds and transports each wafer W in horizontal posture by suction-supporting the surface to be treated (referenced $W_S$ in FIGS. 5A-5C and FIG. 6) of the wafer W. The jig holding arm 13c holds and transports each jig P in horizontal posture by suction-supporting the lower surface of the jig P from below. The wafer holding arm 13b and jig holding arm 13c are supported by the base 13a, to be movable, relative to the base 13a, backward and forward in directions of arrows ra and rb of FIG. 1, and swivelable in directions of arrows rc and rd of FIG. 1, respectively. The wafer and jig transport mechanism 13, with the base 13a, wafer holding arm 13b and jig holding arm 13c, transports the wafers W and jigs P to and from the cassette support table 11, jig storage rack 12 and hot plate 14.

To describe this more particularly, the wafer and jig transport mechanism 13, by means of the jig holding arm 13c, fetches a jig P stored in the jig storage rack 12 and places it on the hot plate 14. Then, the wafer and jig transport mechanism 13, by means of the wafer holding arm 13b, fetches a wafer W to be treated from the cassette C on the cassette support table 11, and places it on the hot plate 14 having the jig P already placed thereon. When placing the wafer W on the hot plate 14, the wafer holding arm 13b is turned over so that the surface $W_S$ to be treated of the wafer W becomes the upper surface, and the lower surface (referenced $W_R$ in FIGS. 5A-5C and FIG. 6) of the wafer W is joined to the jig P already placed on the hot plate 14. That is, the surface $W_S$ to be treated of the wafer W corresponds to the surface of the wafer reverse to the surface (the lower surface when placed) $W_R$ joined to the jig P.

On the other hand, the wafer and jig transport mechanism 13, by means of the wafer holding arm 13b, receives a treated wafer W from the hot plate 14, and stores the treated wafer W in the cassette C placed on the cassette support table 11. The wafer and jig transport mechanism 13, by means of the jig holding arm 13c, receives a jig P from the hot plate 14, and stores the jig P in the jig storage rack 12. When receiving a wafer W from the hot plate 14, the wafer W is placed with the joined surface $W_R$ facing down, and the thinned surface $W_S$ facing up, and the wafer holding arm 13b suction-supports the wafer W from above. Subsequently, the wafer holding arm 13b is turned over, thereby suction-supporting the thinned surface $W_S$, now facing down, of the wafer W from below.

The hot plate 14 has a plurality of (i.e. three in FIG. 1) lift pins 14a arranged thereon. These lift pins 14a are vertically movable. When placing a jig P, the lift pins 14a are projected from the upper surface of the hot plate 14 to support the lower surface of the jig P directly. The projected lift pins 14a form a minute space between the lower surface of the jig P and the upper surface of the hot plate 14. When the jig holding arm 13c of the wafer and jig transport mechanism 13 suction-supporting, from below, the lower surface of the jig P in horizontal posture places the jig P on the hot plate 14, the jig P is directly supported by the lift pins 14a, and the jig holding arm 13c moves into the minute space noted above. The jig holding arm 13c retreats after releasing the jig P, thereby placing the jig P on the hot plate 14. In time of heating, the lift pins 14a are lowered, whereby the upper surface of the hot plate 14 suction-supports the lower surface of the jig P.

On the other hand, when receiving a jig P from the hot plate 14, the lift pins 14a are raised to support the lower surface of the jig P directly and form the minute space. The jig holding arm 13c moves forward into the minute space. Then, the jig holding arm 13c suction-supports the lower surface of the jig P, and receives the jig P as the lift pins 14a lower.

The hot plate 14 heats a jig P before joining the jig P and a wafer W, and heats a jig P before separating the jig P and a thinned wafer W. Thus, the hot plate P in this embodiment carries out joining and separation besides heating of the jigs P. The hot plate 14 corresponds to the joining device in this invention.

Figure 5A:
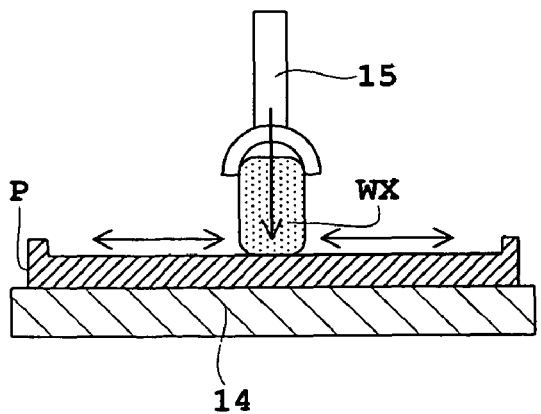
FIG. 5A is an explanatory view schematically showing a process of joining a wafer to a jig.

As shown in FIG. 5A, an application mechanism 15 disposed above the hot plate 14 for applying solid bonding wax (fixing composition) WX to the surface of the recess of each jig P. This application mechanism 15 usually is retracted from the hot plate 14, and is movable to the hot plate 14 for wax application.

The first transport mechanism 31 has a base 31a and a holding arm 31b for transporting a jig P joined with a wafer W. The base 31a is vertically movable. The holding arm 31b holds and transports the jig P in horizontal posture by suction-supporting the lower surface of the jig P from below. The holding arm 31b is supported by the base 31a, to be movable, relative to the base 31a, backward and forward in directions of arrow re of FIG. 1, and swivelable in directions of arrow rf and rd of FIG. 1. The first transport mechanism 31, with the base 31a and holding arm 31b, transports the jig P joined with the wafer W between the hot plate 14 and posture change mechanism 32.

To describe this more particularly, the first transport mechanism 31, by means of the holding arm 31b, fetches the jig P joined with the wafer W from the hot plate 14, and passes the jig P to the posture change mechanism 32. When transferring the jig P from this hot plate 14 to the first transport mechanism 31, the lift pins 14a of the hot plate 14 are raised to support the lower surface of the jig P directly and form the minute space. The holding arm 31b moves forward into the minute space. Then, the holding arm 31b suction-supports the lower surface of the jig P, and the lift pins 14a lower, whereby the jig P is transferred from the lift pins 14a to the holding arm 31b.

On the other hand, the first transport mechanism 31, by means of the holding arm 31b, receives a jig P joined with a treated wafer W from the posture change mechanism 32, and places the jig P on the hot plate 14. Since the wafer W joined to the jig P has been thinned, the hot plate 14 heats the jig P before the jig P and wafer W are separated. When the jig P is passed from the first transport mechanism 31 to the hot plate 14, the lift pins 14a of the hot plate 14 are raised to support the lower surface of the jig P directly and form the minute space, and the holding arm 31b moves into the minute space. The holding arm 31b retreats after releasing the jig P, thereby transferring the jig P from the holding arm 31b to the lift pins 14a.

The posture change mechanism 32 changes the posture of a plurality of (e.g. 25) jigs P en bloc, and has a swing table 32a, a first aligner 32b, a first holder 32c, a second holder 32d and a second aligner 32e. The posture change mechanism 32 turns the jigs P from horizontal posture to vertical posture, and vice versa.

When the jigs P are in horizontal posture, the swing table 32a has, arranged on the upper surface thereof, the first aligner 32b, first holder 32c, second holder 32d and second aligner 32e in the stated order from adjacent the first transport mechanism 31. The swing table 32a is swingable about the axis of a rotary shaft AX to turn the jigs P from horizontal posture to vertical posture. Then, the swing table 32a has, arranged in order from above, the first aligner 32b, first holder 32c, second holder 32d and second aligner 32e. The first aligner 32b and second aligner 32e arrange opposite ends of the jigs P to be flush, and are in the form of vertical rods movable in parallel along a groove formed in the swing table 32a. When the jigs P are in vertical posture, the first aligner 32b aligns the upper ends of the jigs P, and the second aligner 32e the lower ends thereof. When the jigs P are in horizontal posture, the first aligner 32b aligns the ends adjacent the first transport mechanism 31, and the second aligner 32e aligns the ends adjacent the pusher 33. Each of the first holder 32c and second holder 32d define grooves in multiple stages for contacting and supporting the jigs P. In this embodiment, the number of grooves corresponds to the number of (e.g. 25) jigs P in one group (lot). FIG. 1 shows the jigs P in horizontal posture, the grooves formed in the first and second holders 32c and 32d for contacting and supporting the jigs P are omitted from this figure.

The pusher 33 transports the jigs P en bloc, lot by lot, between the posture change mechanism 32 and a second transport mechanism 21 of the treating unit 20, and defines grooves in multiple stages in upper positions thereof for contacting and supporting the jigs P in vertical posture. The pusher 33 is vertically movable, and movable in parallel in directions of arrow rg in FIG. 1.

To describe the posture change mechanism 32 and pusher 33 more particularly, the posture change mechanism 32, by means of the first and second holders 32c and 32d, receives each jig P transported in horizontal posture by the first transport mechanism 31. The first and second aligners 32b and 32e arrange the opposite ends of wafers W in order. When the jigs P reach the predetermined number, the swing table 32a swings about the axis of the rotary shaft AX to turn the jigs P in one lot from horizontal posture to vertical posture. At this time, the pusher 33 is moved in parallel and vertically to a receiving position so that the jigs P in vertical posture are supported in the grooves of the pusher 33. The pusher 33 transports and transfers the jigs P in vertical posture to the second transport mechanism 21.

On the other hand, the pusher 33 receives jigs P joined with treated wafers W from the second transport mechanism 21, supports the jigs P in vertical posture in the grooves, and transports and transfers the jigs P in vertical posture to the posture change mechanism 32. At this time, the pusher 33 is first placed below the posture change mechanism 32 and is raised to pass the jigs P in vertical posture to the first and second holders 32c and 32d. The first and second aligners 32b and 32f arrange the opposite ends of the jigs P to be flush. The swing table 32a swings about the axis of the rotary shaft AX to turn the jigs P in one lot from vertical posture to horizontal posture. The first transport mechanism 31 fetches one jig P at a time, and places it in horizontal posture on the hot plate 14.

The treating unit 20 includes the second transport mechanism 21, two treating transport mechanisms 22 and 23, a cleaning tank 24 and a treating tank 25. The treating transport mechanism 22 holds jigs P, vertically moves inside the cleaning tank 24, and immerses the jigs P in a cleaning solution in the cleaning tank 24 for cleaning treatment. The treating transport mechanism 23 holds jigs P, vertically moves inside the treating tank 25, and immerses the jigs P in a treating solution in the treating tank 25 for thinning wafers W.

The second transport mechanism 21 transports jigs P en bloc, lot by lot, between the pusher 33, cleaning tank 24 and treating tank 25, and has two clamps 21a for laterally clamping the jigs P in vertical posture. The clamps 21a have grooves formed in multiple stages in side surfaces thereof for contacting and supporting the jigs P at opposite sides thereof. The second transport mechanism 21 is movable in parallel in directions of arrow rh in FIG. 1.

The treating transport mechanisms 22 and 23 are vertically movable relative to the cleaning tank 24 and treating tank 25, respectively. The treating transport mechanism 23 which immerses wafers W in the treating solution in the treating tank 25 for thinning treatment will be described with reference to FIG. 3. The other treating transport mechanism 22 for immersing the wafers W in the cleaning solution in the cleaning tank 24 for cleaning treatment has the same construction as the transport mechanism 23 and will not be described. The transport mechanism 23 has a back plate 23a elongated vertically, and three holding elements 23b extending horizontally from the lower end of the back plate 23a. The holding elements 23b have grooves formed in multiple stages in upper surfaces thereof for contacting and supporting the jigs P.

The treating transport mechanism 23 lowers the jigs P joined with wafers W to be treated, from a position for transfer to/from the second transport mechanism 21 into the treating tank 25. After thinning treatment, the transport mechanism 23 raises the jigs P joined with treated wafers W from the treating tank 25 to the position for transfer. The transport mechanism 23 holds the jigs P and wafers W and immerses them in the treating tank 25 for thinning treatment. The treating transport mechanism 22 lowers the jigs P joined with wafers W from a position for transfer into the cleaning tank 24 and, after cleaning treatment, raises the jigs P and wafers from the cleaning tank 24 to the position for transfer. The transport mechanism 22 holds the jigs P and wafers W and immerses them in the cleaning tank 24 for cleaning treatment.

More particularly, the second transport mechanism 21, by means of the clamps 21a, receives the jigs P transported in vertical posture by the pusher 33, and passes the jigs P on to the treating transport mechanism 23. At this time, the treating transport mechanism 23 is first set below the second transport mechanism 21, and then is raised to receive, by means of the holding elements 23b, the jigs P in vertical posture. The treating transport mechanism 23 lowers the jigs P for thinning treatment of the wafers W and, after the treatment, raises the jigs P and wafers W. While ascending, the treating transport mechanism 23 transfers the jigs P in vertical posture to the second transport mechanism 21. The second transport mechanism 21, by means of the clamps 21a, receives the jigs P, and transports and transfers the jigs P to the pusher 33. When cleaning treatment is required before the thinning treatment, the second transport mechanism 21 passes the jigs P and wafers W on to the treating transport mechanism 22 which performs the cleaning treatment in the same way as the treating transport mechanism 23 performs the thinning treatment. When cleaning treatment is required after the thinning treatment, the second transport mechanism 21 passes the jigs P and wafers W received from the treating transport mechanism 23 on to the treating transport mechanism 22 which performs the cleaning treatment in the same way as the treating transport mechanism 23 performs the thinning treatment.

The hot plate 14 corresponds to the joining unit and heating mechanism in this invention. The pusher 33 and second transport mechanism 21 correspond to the second transport mechanism in this invention. The treating transport mechanism 23 corresponds to the holding mechanism in this invention.

The wafer treating apparatus in this embodiment includes a controller 40 for performing an overall control of the various components of the indexer 10 and treating unit 20 described above. The controller 40 is composed of a central processing unit (CPU) and other devices. Based on use situations of the cassette support table 11 and jig storage rack 12, a temperature situation of the hot plate 14, transporting situations of the transport mechanisms 13, 21-23 and 31 and the pusher 33, a posture situation of the posture change mechanism 32, and treating situations of the cleaning tank 24 and treating tank 25, the controller 14 controls the hot plate 14, transport mechanisms 13, 21-23 and 31, pusher 33 and posture change mechanism 32. Especially, the controller 40 controls the treating transport mechanism 23 to thin the wafers W by etching, with the treating solution, the surface (surface $W_S$ to be treated) of each wafer W reverse to the joined surface $W_R$. It is to be noted that the front face having a circuit formed thereon is the joined surface $W_R$, and the back surface is the surface $W_S$ to be treated.

Figure 4:
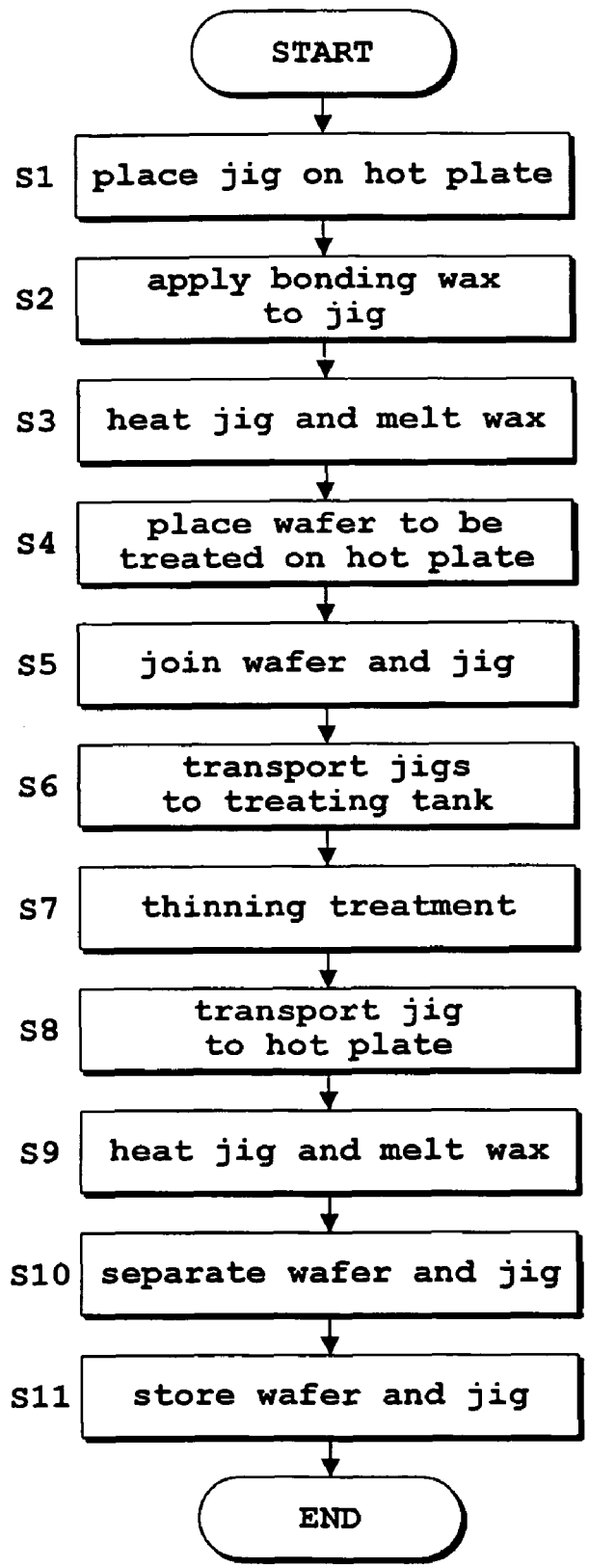
FIG. 4 is a flow chart showing operation of the wafer treating apparatus.
Figure 5B:
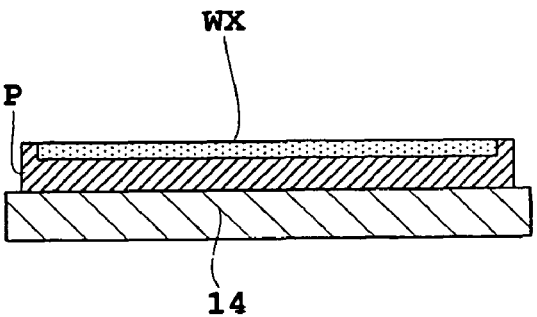
FIG. 5B is an explanatory view schematically showing the process of joining the wafer to the jig.
Figure 5C:
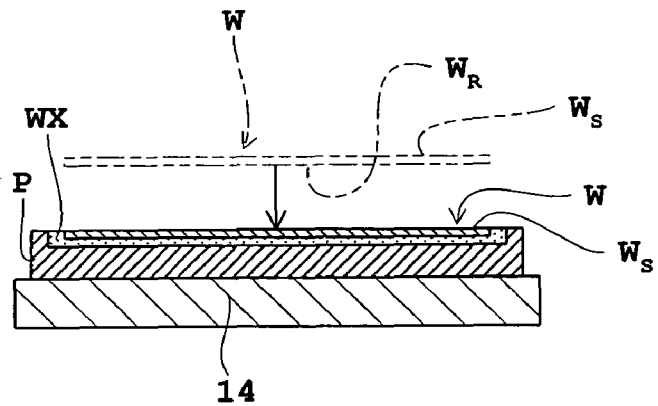
FIG. 5C is an explanatory view schematically showing the process of joining the wafer to the jig.
Figure 6:
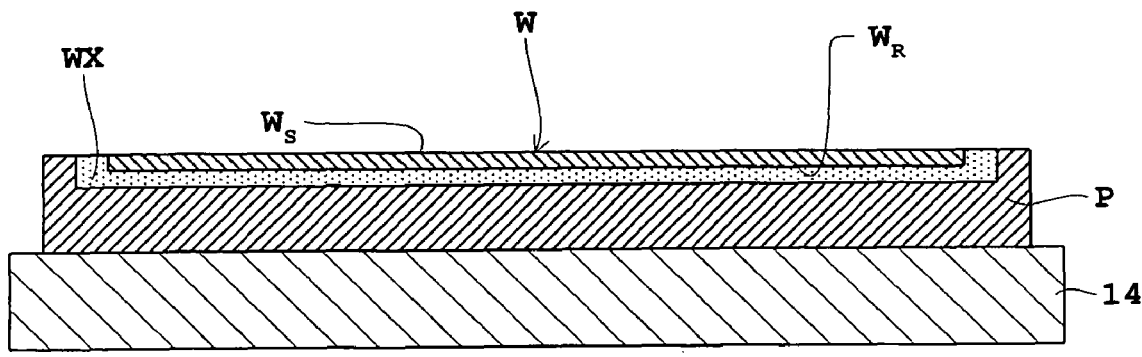
FIG. 6 is an explanatory view schematically showing the wafer being joined to the jig with melted bonding wax (adhesive)
Figure 7:
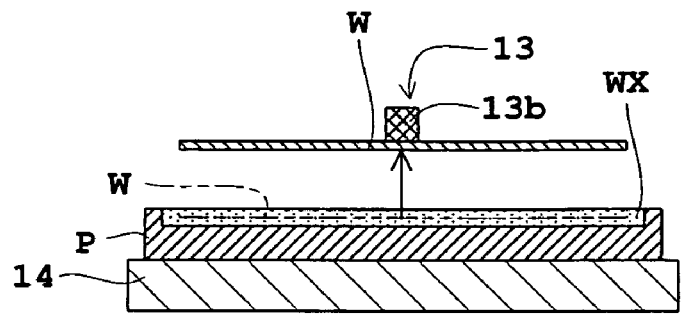
FIG. 7 is an explanatory view schematically showing a thinned wafer being separated from a jig.
Figure 8:
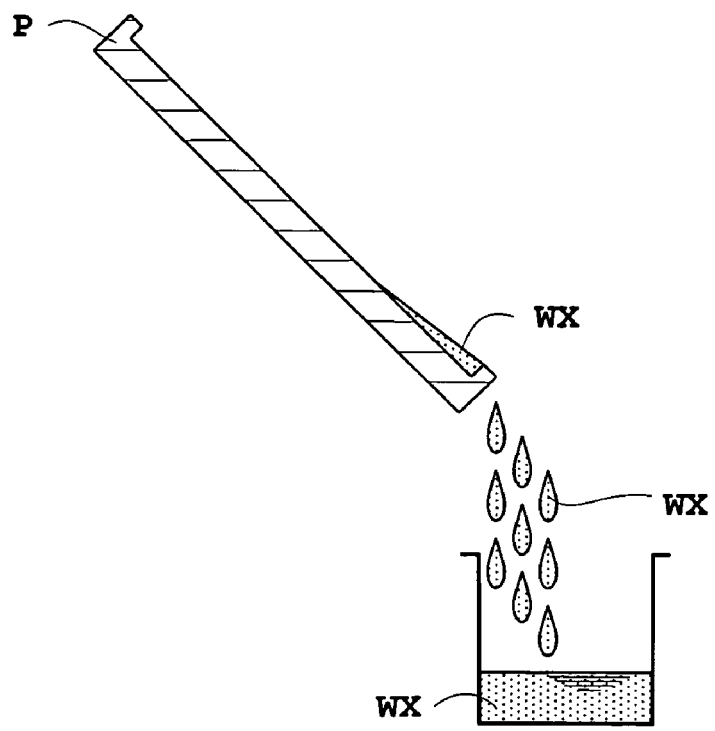
FIG. 8 is an explanatory view schematically showing the adhesive being collected.

Next, a wafer treating method in this embodiment will be described with reference to the flow chart in FIG. 4 and the explanatory views in FIGS. 5A-5C, 6, 7 and 8. FIG. 4 is a flow chart showing operation of the wafer treating apparatus in this embodiment. FIGS. 5A-5C are explanatory views schematically showing a process of joining a wafer to a jig. FIG. 6 is an explanatory view schematically showing the wafer joined to the jig with melted bonding wax (adhesive). FIG. 7 is an explanatory view schematically showing a thinned wafer being separated from a jig. FIG. 8 is an explanatory view schematically showing the adhesive being collected.

(Step S1) Place Jig on Hot Plate:

The wafer and jig transport mechanism 13 fetches a jig P from the jig storage rack 12, and places it on the hot plate 14. Based on a use situation of the jig storage rack 12, a temperature situation of the hot plate 14, a transporting situation of the wafer and jig transport mechanism 13, and so on, the controller 40 controls the wafer and jig transport mechanism 13 and the lift pins 14a of the hot plate 14. The following steps will be described as executed by the controller 40 unless otherwise indicated.

(Step S2) Apply Bonding Wax to Jig:

As shown in FIG. 5A, the application mechanism 15 applies solid bonding wax (adhesive) WX to the surface of the recess, acting as the joining surface, of the jig P. This bonding wax WX is solid at room temperature, and becomes liquid at or above a treating temperature (e.g. 110° C.) for heating to be described hereinafter. In this embodiment, a material having a rate similar to an etching rate of wafers W is used as the bonding wax WX. The bonding wax WX corresponds to the fixing composition in this invention.

(Step S3) Heat Jig and Melt Wax:

The controller 40 controls the heater (not shown) of the hot plate 14 to heat the jig P placed on the hot plate 14. A temperature sensor (not shown) measures the temperature of the hot plate 14. When a predetermined treating temperature (e.g. 110° C.) is reached, the controller 40 controls the heater to maintain the treating temperature constant. As shown in FIG. 5B, the heating of the jig P at this treating temperature melts to a liquid state the bonding wax WX applied to the jig P. Then, the heating of the jig P is stopped.

(Step S4) Place Wafer to be Treated on Hot Plate:

During the heating, the wafer and jig transport mechanism 13 fetches a wafer W to be treated from the cassette C placed on the cassette support table 11. When the bonding wax WX has melted, the wafer W is placed on the hot plate 14 having the jig P already placed thereon. At this time, as shown in FIG. 5C, the wafer W is placed to have the surface $W_S$ to be treated facing up, and the surface $W_R$ to be joined facing down.

(Step S5) Join Wafer and Jig:

Thus, the surface $W_R$ reverse to the surface $W_S$ to be treated of the wafer W is joined to the jig P. When the hot plate 14 cools to room temperature, the bonding wax WX between the wafer W and jig P solidifies to join the wafer W and jig P. When joining the wafer W to the jig P with the bonding wax WX in the melted state, as shown in FIG. 6, the wafer W floats on the melted wax WX. The surface of the wax WX rises, in positions outwardly of the wafer W (i.e. between the end surface of wafer W and the wall of jig P), to the level of the surface $W_S$ to be treated which is reverse to the joined surface $W_R$.

(Step S6) Transport Jigs to Treating Tank:

The first transport mechanism 31 transports the jig P joined with the wafer W in step S5 from the hot plate 14 to the posture change mechanism 32. When jigs P processed in step S5 have reached the predetermined number, the posture change mechanism 32 turns the jigs P in a lot, en bloc, from horizontal posture to vertical posture with a swing of the swing table 32a. The jigs P are passed on to the pusher 33 which transfers the jigs P to the second transport mechanism 21. The second transport mechanism 21 transports the jigs P to the treating tank 25 and transfers the jigs P to the treating transport mechanism 23. When it is necessary to clean the wafers W before thinning treatment in step S7, the second transport mechanism 21 transports the jigs P and wafers W to the cleaning tank 24 before transporting them to the treating tank 25. For cleaning treatment, the second transport mechanism 21 transfers the jigs P to the treating transport mechanism 22. The treating transport mechanism 22 holds the jigs P and immerses them in the cleaning tank 24.

(Step S7) Thinning Treatment:

The treating tank 25 stores an alkaline etching solution such as caustic potash (KOH), for example. The treating transport mechanism 23 holds the jigs P and immerses them in the treating tank 25 for thinning treatment of the wafers W. The treating solution for etching is not limited to caustic potash, but may be a solution usually used in thinning treatment, typically sodium hydroxide (NaOH). The joined surfaces $W_R$ are covered and protected by the jigs P, and are therefore not etched. On the other hand, the surfaces $W_S$ to be treated are exposed, and are therefore etched thin.

(Step S8) Transport Jig to Hot Plate:

Upon completion of the thinning treatment, the treating transport mechanism 23 pulls the jigs P up from the treating tank 25, and passes them on to the second transport mechanism 21. When it is necessary to clean the wafers W after the thinning treatment in step S7, the second transport mechanism 21 transports the jigs P and wafers W to the cleaning tank 24. Otherwise, the second transport mechanism 21 having received the jigs P transports them to the pusher 33. The pusher 33 transports the jigs P to the posture change mechanism 32. The posture change mechanism 32 turns the jigs P in a lot, en bloc, from vertical posture to horizontal posture with a swing of the swing table 32a. Then, the first transport mechanism 31 takes one jig P at a time from the posture change mechanism 32, and places it in horizontal posture on the hot plate 14.

(Step S9) Heat Jig and Melt Wax:

After the jig P is placed on the hot plate 14, the hot plate 14 heats the jig P directly. The heating of the jig P melts the boding wax WX applied. When the wax WX has melted, the heating of jig P is stopped.

(Step S10) Separate Wafer and Jig:

After the bonding wax WX melts, the holding arm 13b of the wafer and jig transport mechanism 13 sucks and supports only the wafer W from above the treated surface $W_S$ facing up. As the wafer and jig transport mechanism 13 transports only the wafer W, as shown in FIG. 7, the jig P and wafer W are separated from each other, with the bonding wax WX in the melted state. In order to use the bonding wax WX remaining in the recess of the jig P for wafers W to be treated subsequently, the jig P is tilted as shown in FIG. 8 to collect the bonding wax WX in the melted state. The jig P may be tilted, for example, by using an overturn of the jig holding arm 13c of the wafer and jig transport mechanism 13, or by constructing the hot plate 14 itself to be tiltable.

(Step S11) Store Wafer and Jig:

The wafer and jig transport mechanism 13 receives the thinned wafer W from the hot plate 14, and stores it in the cassette C. The wafer and jig transport mechanism 13 receives also the separated jig P from the hot plate 14, and places it in the jig storage rack 12.

With the wafer treating apparatus in this embodiment, jigs P and wafers W are joined together by the bonding wax WX on the hot plate 14. The first transport mechanism 31, posture change mechanism 32, pusher 33 and second transport mechanism 32 transport the jigs P joined with the wafers W from the hot plate 14 to the treating transport mechanism 23. The treating transport mechanism 23 immerses the jigs P joined with the wafers W in the treating solution stored in the treating tank 25. Thus, the wafers W may be thinned, or otherwise treated, without a turn table directly contacting and damaging the wafers W as in the prior art.

Since thinned wafers W are joined in close contact with the jigs P, the wafers W may be transported stably by the first transport mechanism 31, pusher 33 and second transport mechanism 21 that transport the jigs P. The wafers W may be treated stably also when subjected to treatment other than thinning treatment.

In this embodiment, before the joining in step S5, the solid bonding wax WX is applied to the surface of the recess, acting as the joining surface, of each jig P, and the jig P is heated by the hot plate 14 to melt the applied bonding wax WX to a liquid state. The melted wax WX joins a wafer W to the jig P. The bonding wax WX can join the wafer W to the jig P reliably, and can prevent separation of the jig P and wafer W in the course of treatment.

Where the wafer W is joined to the jig P by using the bonding wax WX, the bonding wax WX between the jig P and thinned wafer W is melted by heating the jig P with the hot plate 14. The jig P and wafer W are separated with the wax WX in the melted state.

In this embodiment, the bonding wax WX after the separation in step S10 is used also for subsequent wafers W. By reusing the bonding wax WX, consumption of the bonding wax WX is reduced.

When the wafer W is joined to the jig P by the bonding wax WX in the melted state, as described hereinbefore, and as shown in FIG. 6, the wafer W floats on the melted bonding wax WX. The surface of the wax WX rises, in positions outwardly of the wafer W, to the level of the surface $W_S$ to be treated which is reverse to the joined surface $W_R$. Thinning treatment performed after curing of the bonding wax WX results in a level difference between the raised parts of the bonding wax WX and the wafer W. This level difference could cause the wafer W to peel off the jig P in the course of treatment, or cause stress on and damage the wafer W in time of separation. This is due to a difference in etching rate occurring during the thinning treatment between the wafer W and bonding wax WX. The above level difference may be reduced by using, as the bonding wax (adhesive) WX, a material having a rate similar to the etching rate of wafer W.

As is the bonding wax WX, the jig separated in step S10 may be used also for subsequent wafers W. By reusing the jig P, consumption of jigs P may be reduced.

Amorphous carbon or SiC for forming the jigs P in this embodiment has heat resistance as well as chemical resistance. For example, when melting the applied bonding wax WX by heating the jig P in step S3, or when melting the bonding wax WX between the jig P and wafer W by heating the jig P in step S9, the jig P having heat resistance is invulnerable to breakage, deformation and melting due to the heating.

Amorphous carbon or SiC noted above has a coefficient similar to the thermal expansion coefficient of wafers W. For example, when melting the applied bonding wax WX by heating the jig P in step S3, or when melting the bonding wax WX between the jig P and wafer W by heating the jig P in step S9, the coefficient of the jig P similar to the thermal expansion coefficient of wafers W can prevent the wafers W from peeling off the jigs P in the course of treatment, and stress from acting on and damaging the wafers W in time of separation, which could be caused by a difference in expansion coefficient.

This invention is not limited to the foregoing embodiment, but may be modified as follows:

(1) In the foregoing embodiment, the hot plate 14 is used for both joining and separation. Instead, different hot plates may be provided to be used for joining and separation, respectively. In this case, the hot plate for separation may be constructed outside the wafer treating apparatus.

(2) In the foregoing embodiment, the hot plate 14 serves for both joining and separation. However, the performance of the joining and separating functions is not limited to a heating mechanism represented by the hot plate 14. For example, the hot plate 14 may be used only for melting the adhesive, and a construction other than the hot plate 14 may be used for joining or separation.

(3) In the foregoing embodiment, each jig includes a recess having a size for accommodating a wafer, and a wall surrounding the recess. The shape of the jig is not limited to this. The jig may be in the shape of a flat plate, for example.

This invention may be embodied in other specific forms without departing from the spirit or essential attributes thereof and, accordingly, reference should be made to the appended claims, rather than to the foregoing specification, as indicating the scope of the invention.

What is claimed is:

1. A wafer treating apparatus comprising:
   a joining device for joining jigs and wafers with a fixing composition;
   a treating tank for storing a liquid for treating surfaces of the wafers;
   a holding mechanism for holding the jigs joined with the wafers, as immersed in the liquid stored in said treating tank; and
   a transport mechanism for transporting the jigs joined with the wafers between said joining device and said holding mechanism;
   wherein said joining device includes:
   a heating mechanism for holding and heating the jigs; and
   an application mechanism for applying the fixing composition to a surface of each jig held by said heating mechanism; and
   wherein said transport mechanism includes:
   a first transport mechanism for removing the jigs joined with the wafers from said heating mechanism;

a posture change mechanism for turning the jigs removed by said first transport mechanism from horizontal posture to vertical posture; and a second transport mechanism for transporting the jigs turned to vertical posture by said posture change mechanism to said holding mechanism.

2. A wafer treating apparatus as defined in claim 1, further comprising:

a jig storage unit for storing a plurality of jigs;

a wafer storage unit for storing a plurality of wafers;

a jig transport mechanism for transporting the jigs between said jig storage unit and said heating mechanism; and a wafer transport mechanism for transporting the wafers between said wafer storage unit and said heating mechanism.

3. A wafer treating apparatus as defined in claim 2, wherein said jig transport mechanism transports the jigs from said jig storage unit to said heating mechanism, said heating mechanism heats the jigs, said application mechanism applies the fixing composition to a surface of each jig, and said wafer transport mechanism transports the wafers from said wafer storage unit to the jigs placed on said heating mechanism.

4. A wafer treating apparatus as defined in claim 2, wherein said transport mechanism transports the jigs joined with the wafers having surfaces treated in said treating tank, from said holding mechanism to said joining device, said heating mechanism heats the jigs to melt the fixing composition, said wafer transport mechanism transports the wafers from the jigs placed on said heating mechanism to said wafer storage unit, and said jig transport mechanism transports the jigs from said heating mechanism to said jig storage unit after the fixing composition is removed from the jigs.

5. A wafer treating apparatus as defined in claim 1, wherein:

said second transport mechanism is arranged to transport the jigs from said holding mechanism to said posture change mechanism;

said posture change mechanism is arranged to turn the jigs transported by said second transport mechanism from vertical posture to horizontal posture; and said first transport mechanism is arranged to transport the jigs turned to horizontal posture by said posture change mechanism to said heating mechanism.

6. A wafer treating apparatus as defined in claim 2, wherein said wafer transport mechanism and said jig transport mechanism are integrated into a wafer and jig transport mechanism for transporting the wafers and the jigs separately, said wafer and jig transport mechanism including:

a vertically movable base; and a wafer holding arm and a jig holding arm supported by said base to be movable backward and forward and swivelable relative to said base.

7. A wafer treating apparatus as defined in claim 1, wherein said posture change mechanism is arranged to change posture of a plurality of jigs en bloc.

8. A wafer treating apparatus as defined in claim 1, wherein said second transport mechanism is arranged to transport a plurality of jigs en bloc.

9. A wafer treating apparatus as defined in claim 7, wherein said first transport mechanism passes the jigs to said posture change mechanism, and when the jigs reach a predetermined number, said posture change mechanism turns the jigs en bloc from horizontal posture to vertical posture.

10. A wafer treating apparatus as defined in claim 7, wherein said posture change mechanism is arranged to turn the jigs en bloc from horizontal posture to vertical posture, and said first transport mechanism is arranged to fetch one jig at a time from said posture change mechanism.

11. A wafer treating apparatus as defined in claim 1, further comprising a cleaning tank for storing a cleaning liquid.

12. A wafer treating apparatus as defined in claim 11, wherein said cleaning tank is used to clean the jigs in at least one of periods before and after treatment in said treating tank.

* * * * *